(12) United States Patent
de Jong (10) Patent No.: US 8,149,612 B1
(45) Date of Patent: Apr. 3, 2012

(54) MEMORY ARRAY AND METHOD OF IMPLEMENTING A MEMORY ARRAY

(75) Inventor: Jan L. de Jong, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/085,420

(22) Filed: Apr. 12, 2011

Related U.S. Application Data (62) Division of application No. 12/354,202, filed on Jan. 15, 2009, now Pat. No. 7,948,791.

(51) Int. Cl.
*G11C 11/00* (2006.01)
(52) U.S. Cl. .................................................. 365/154
(58) Field of Classification Search ............. 365/154
See application file for complete search history.

(56) References Cited

U.S. PATENT DOCUMENTS

| | | |
|---|---|---|
| 5,148,390 A | 9/1992 | Hsieh |
| 5,774,393 A | 6/1998 | Kuriyama |
| 5,973,965 A | 10/1999 | Berthold et al. |
| 6,373,279 B1 | 4/2002 | Bauer et al. |
| 7,139,190 B1 | 11/2006 | de Jong |
| 7,907,461 B1 * | 3/2011 | Nguyen et al. ............... 365/206 |

OTHER PUBLICATIONS

U.S. Appl. No. 12/354,202, filed Jan. 15, 2009, Jan L. de Jong.

* cited by examiner

*Primary Examiner* — Hoai V Ho
(74) *Attorney, Agent, or Firm* — John J. King (57) ABSTRACT

A memory array having a plurality of memory cells is disclosed, where each memory cell comprises a first inverter having a first transistor coupled between a reference voltage and a first node for receiving input data and a second transistor coupled between the first node and ground; a first inverter comprising a first transistor coupled between a reference voltage and a first node for receiving input data and a second transistor coupled between the first node and ground; a second inverter comprising a third transistor coupled between the reference voltage and a second node for storing inverted input data and a fourth transistor coupled between the second node and ground, the second node being coupled to a control terminal of the second transistor. The memory array further comprises a third inverter and a fourth inverter.

13 Claims, 6 Drawing Sheets

MEMORY ARRAY AND METHOD OF IMPLEMENTING A MEMORY ARRAY

CROSS-REFERENCE TO RELATED APPLICATIONS

This application is a divisional of U.S. patent application having application Ser. No. 12/354,202 filed on Jan. 15, 2009 now U.S. Pat. No. 7,948,791 and titled "Memory Array and Method of Implementing A Memory Array" by Jan L. de Jong.

GOVERNMENT CONTRACT

The U.S. Government may have certain rights to this invention as provided for by the terms of AFRL Contract # FA9453-07-C-0178.

FIELD OF THE INVENTION

The present invention relates generally to integrated circuits, and in particular, to a memory array and method of implementing a memory array.

BACKGROUND OF THE INVENTION

Memory arrays are important elements of many integrated circuits. However, data stored in memory arrays may be lost for a variety of reasons. For example, memory cells of the device may be affected by a single event upset (SEU), such as a cosmic ray striking a memory cell of the device. As the dimensions of transistors continue to decrease, a single event upset may affect a greater number of cells. That is, the charge associated with the cosmic ray striking the device may affect more than one cell. One type of integrated circuit in which memory arrays are critical to the operation of the integrated circuit is a device having programmable logic. Programmable logic enables users to implement logic designs of their choice by storing configuration data in memory elements of the device. However, for the device to function properly, it is necessary that any configuration data loaded into a memory which is corrupted is corrected.

SUMMARY OF THE INVENTION

A memory array having a plurality of memory cells is disclosed, where each memory cell comprises a first inverter having a first transistor coupled between a reference voltage and a first node for receiving input data and a second transistor coupled between the first node and ground; and a second inverter having a third transistor coupled between the reference voltage and a second node for storing inverted input data and a fourth transistor coupled between the second node and ground, the first node being coupled to control terminals of the third transistor and the fourth transistor and the second node being coupled to control the first transistor and the second transistor; wherein the third transistor is implemented with physical dimensions which make the third transistor stronger than the first transistor, or the second transistor is implemented with physical dimensions which make the second transistor stronger than the fourth transistor.

According to an alternate embodiment, a memory array having a plurality of memory cells is disclosed, where each memory cell comprises a first inverter comprising a first transistor coupled between a reference voltage and a first node for receiving input data and a second transistor coupled between the first node and ground; a second inverter comprising a third transistor coupled between the reference voltage and a second node for storing inverted input data and a fourth transistor coupled between the second node and ground, the second node being coupled to a control terminal of the second transistor; a third inverter comprising a fifth transistor coupled between the reference voltage and a third node for storing the input data and a sixth transistor coupled between the third node and ground, the third node being coupled to a control terminal of the fourth transistor; and a fourth inverter comprising a seventh transistor coupled between the reference voltage and a fourth node for storing the inverted input data and an eight transistor coupled between the fourth node and ground, the fourth node being coupled to a control terminal of the sixth transistor; wherein the third and seventh transistors are implemented with physical dimensions which make the third and seventh transistor stronger than the first and fifth transistors, or the second and sixth transistors are implemented with physical dimensions which make the second and sixth transistors stronger than the fourth and eighth transistors.

A method of implementing a memory array having a plurality of memory cells is also disclosed. The method comprises providing pull-up transistors of a plurality of invertors for each memory cell of the plurality of memory cells; coupling pull-down transistors to the pull-up transistors of the plurality of invertors for each memory cell of the plurality of memory cells, where each pull-down transistor is coupled to a corresponding pull-up transistor to form a plurality of nodes for storing one of input data or inverted input data at each node of the plurality of nodes; and selecting dimensions for each transistor of the pull-up transistors and the pull-down transistors to cause at least one node of the plurality of nodes to have a preference for storing a logical zero value.

DETAILED DESCRIPTION OF THE DRAWINGS

Figure 1:
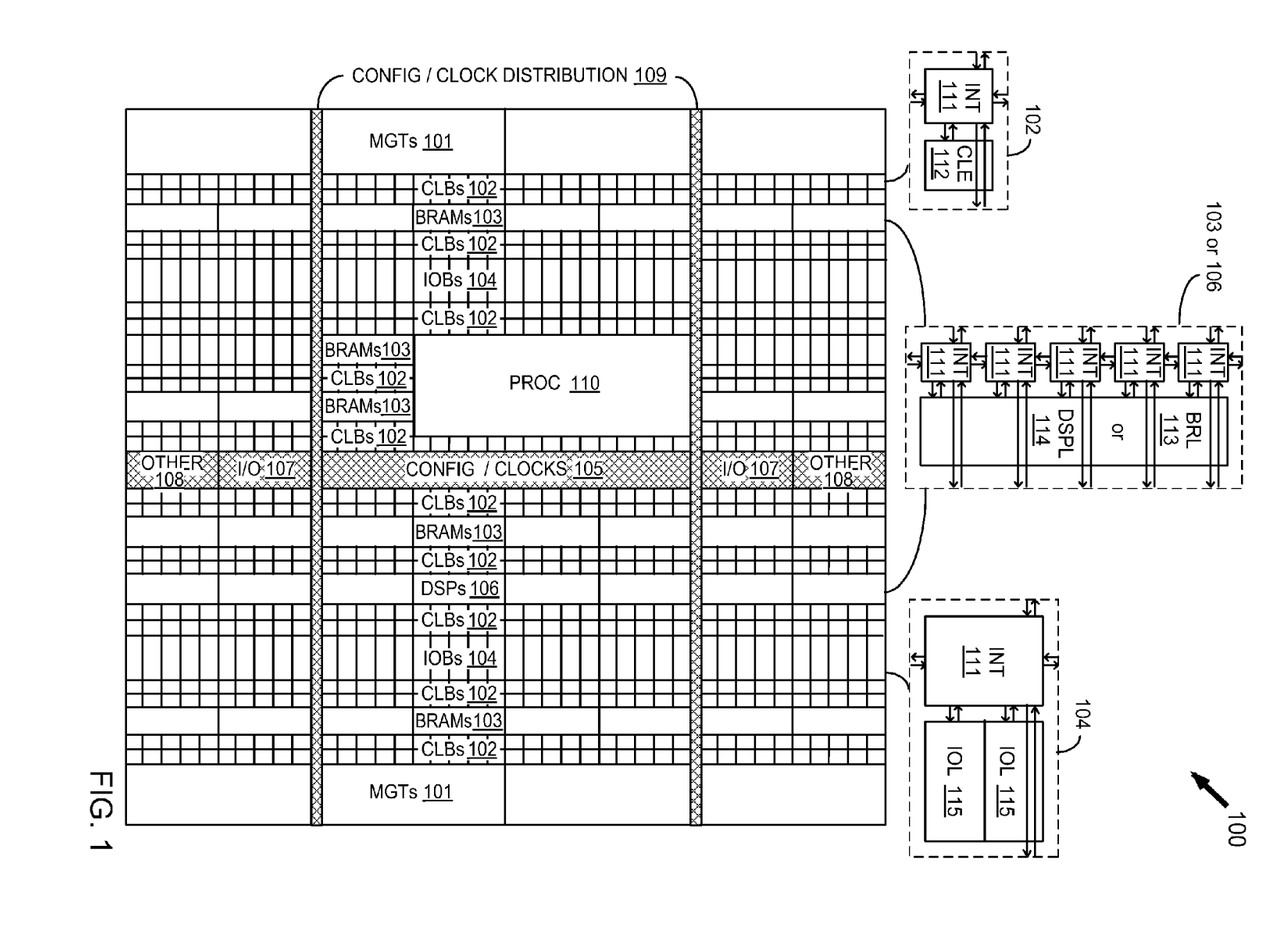
FIG. 1 is a block diagram of a device having programmable logic according to an embodiment the present invention.

Turning first to FIG. 1, a block diagram of a device having programmable logic according to an embodiment the present invention is shown. While devices having programmable logic may be implemented in any type of integrated circuit device, such as an application specific integrated circuit (ASIC) having programmable logic, other devices comprise dedicated programmable logic devices. A programmable logic device (PLD) is an integrated circuit device designed to be user-programmable so that users may implement logic designs of their choices. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

The device of FIG. 1 comprises an FPGA architecture 100 having a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 may include a configurable logic element (CLE 112) that may be programmed to implement user logic plus a single programmable interconnect element (INT 111). A BRAM 103 may include a BRAM logic element (BRL 113) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 106 may include a DSP logic element (DSPL 114) in addition to an appropriate number of programmable interconnect elements. An IOB 104 may include, for example, two instances of an input/output logic element (IOL 115) in addition to one instance of the programmable interconnect element (INT 111). The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks may be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic. The circuits and methods of the present invention may be implemented in the PLD of FIG. 1, or in any other suitable device or devices, including any type of integrated circuit having programmable logic.

Figure 2:
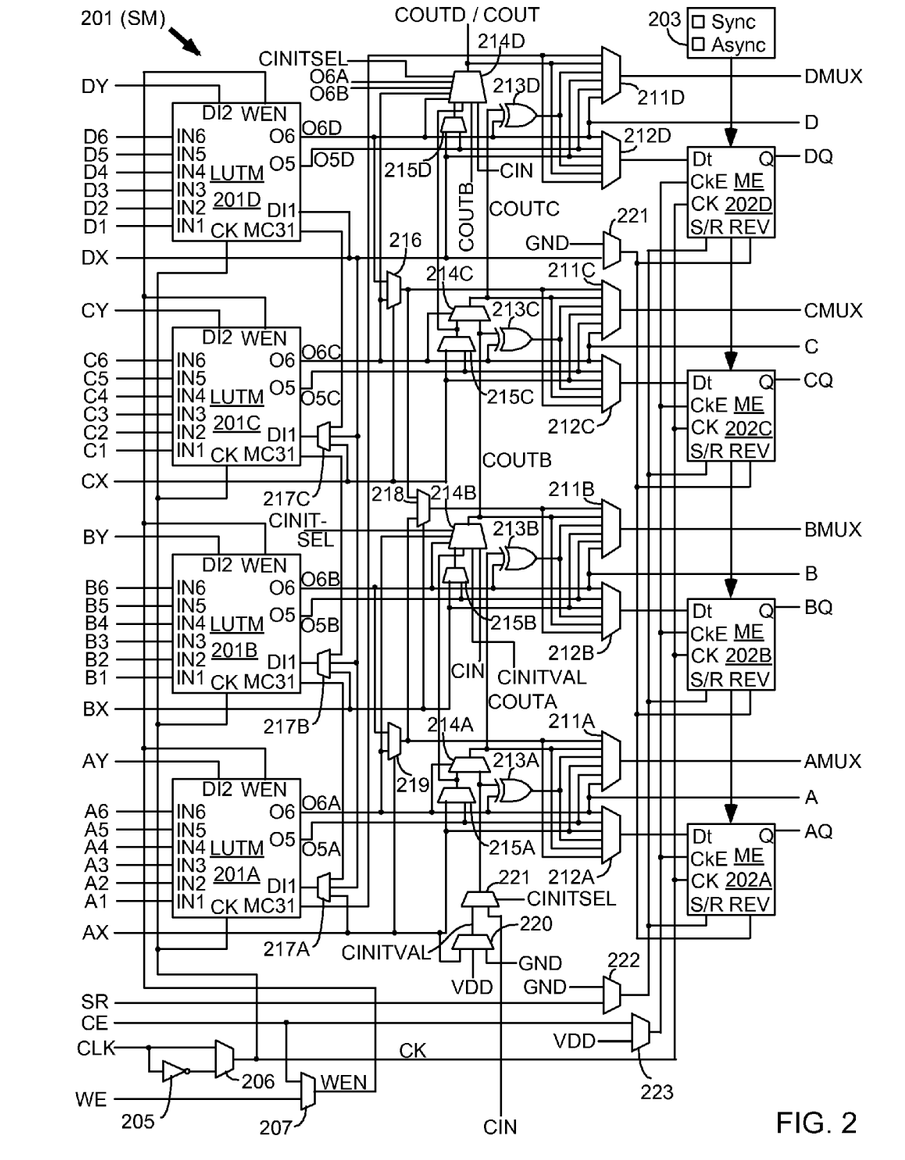
FIG. 2 is a block diagram of a configurable logic element of the device of FIG. 1 according to an embodiment of the present invention.

Turning now to FIG. 2, a block diagram of a configurable logic element of the device of FIG. 1 according to an embodiment of the present invention is shown. In particular, FIG. 2 illustrates in simplified form a configurable logic element of a configuration logic block 102 of FIG. 1. In the embodiment of FIG. 2, slice M 201 includes four lookup tables (LUTMs) 201A-201D, each driven by six LUT data input terminals A1-A6, B1-B6, C1-C6, and D1-D6 and each providing two LUT output signals O5 and O6. The O6 output terminals from LUTs 201A-201D drive slice output terminals A-D, respectively. The LUT data input signals are supplied by the FPGA interconnect structure via input multiplexers, which may be implemented by programmable interconnect element 211, and the LUT output signals are also supplied to the interconnect structure. Slice M also includes: output select multiplexers 211A-211D driving output terminals AMUX-DMUX; multiplexers 212A-212D driving the data input terminals of memory elements 202A-202D; combinational multiplexers 216, 218, and 219; bounce multiplexer circuits 222-223; a circuit represented by inverter 205 and multiplexer 206 (which together provide an optional inversion on the input clock path); and carry logic comprising multiplexers 214A-214D, 215A-215D, 220-221 and exclusive OR gates 213A-213D. All of these elements are coupled together as shown in FIG. 2. Where select inputs are not shown for the multiplexers illustrated in FIG. 2, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 2 for clarity, as well as from other selected figures herein.

In the pictured embodiment, each memory element 202A-202D may be programmed to function as a synchronous or asynchronous flip-flop or latch. The selection between synchronous and asynchronous functionality is made for all four memory elements in a slice by programming Sync/Asynch selection circuit 203. When a memory element is programmed so that the S/R (set/reset) input signal provides a set function, the REV input terminal provides the reset function. When the memory element is programmed so that the S/R input signal provides a reset function, the REV input terminal provides the set function. Memory elements 202A-202D are clocked by a clock signal CK, which may be provided by a global clock network or by the interconnect structure, for example. Such programmable memory elements are well known in the art of FPGA design. Each memory element 202A-202D provides a registered output signal AQ-DQ to the interconnect structure. Because each LUT 201A-201D provides two output signals, O5 and O6, the LUT may be configured to function as two 5-input LUTs with five shared input signals (IN1-IN5), or as one 6-input LUT having input signals IN1-IN6.

In the embodiment of FIG. 2, each LUTM 201A-201D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 217A-217C for LUTs 201A-201C), or to the two 32-bit RAMs via input terminals DI1 and DI2. RAM write operations in the LUT RAMs are controlled by clock signal CK from multiplexer 206 and by write enable signal WEN from multiplexer 207, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 201A may also be provided to the general interconnect structure for shift register chaining, via output select multiplexer 211D and CLE output terminal DMUX. The devices having programmable logic and methods of the present invention may be implemented according to the device of FIGS. 1 and 2, or in any device, including any type of integrated circuit having programmable logic.

Figure 3:
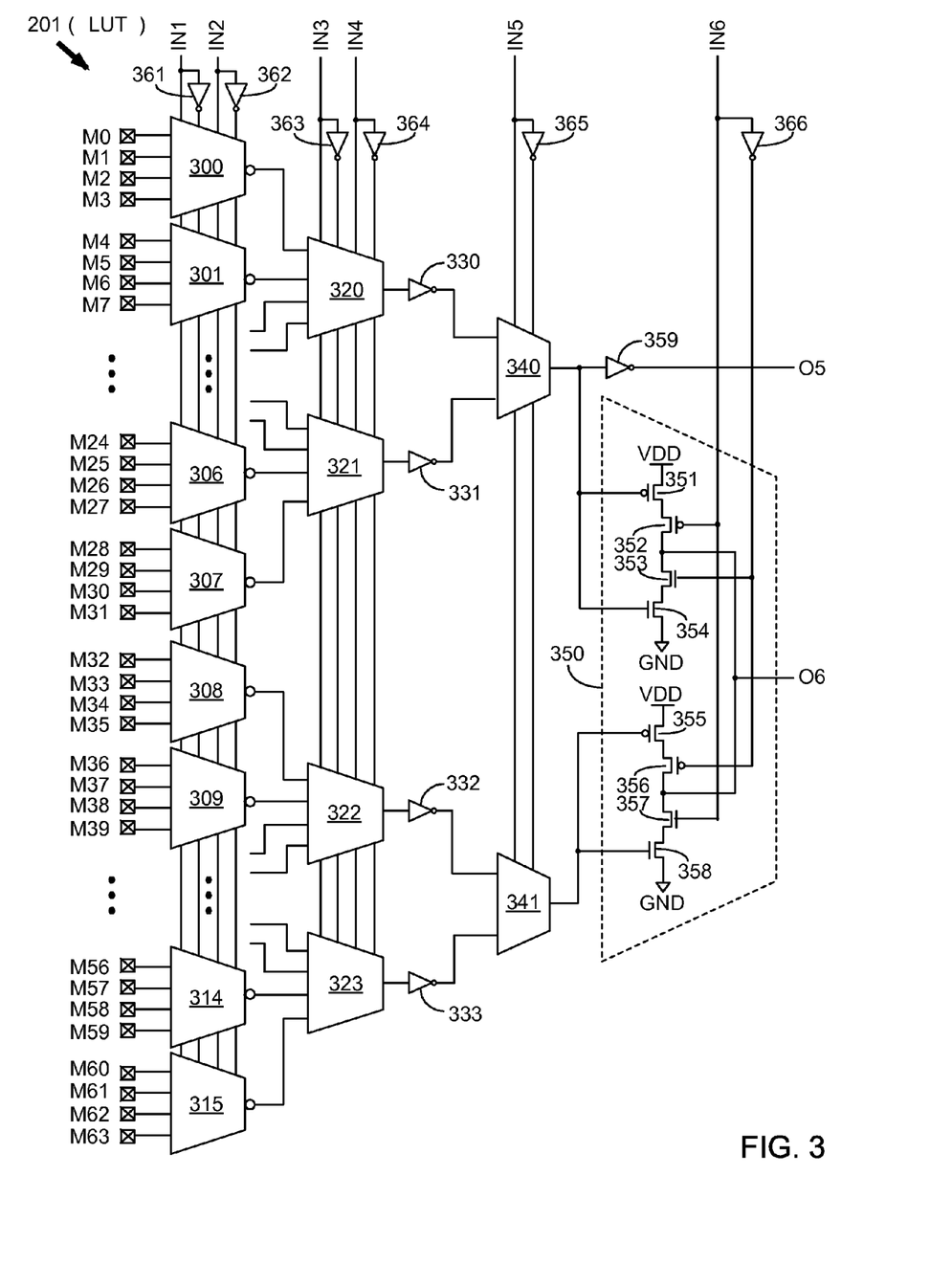
FIG. 3 is a block diagram of the look-up table of the configurable logic element of FIG. 2 according to an embodiment of the present invention.

Turning now to FIG. 3, a block diagram of the look-up table of the configurable logic element of FIG. 2 according to an embodiment of the present invention is shown. In the embodiment of FIG. 3, configuration memory cells M0-M63 drive 4-to-1 multiplexers 300-315, which are controlled by input signals IN1, IN2 and their inverted counterparts (provided by inverters 361, 362) to select 16 of the signals from the configuration memory cells. The selected 16 signals drive four 4-to-1 multiplexers 320-323, which are controlled by input signals IN3, IN4 and their inverted counterparts (provided by inverters 363, 364) to select four of the signals to drive inverters 330-333. Inverters 330-333 drive 2-to-1 multiplexers 340-341, which are controlled by input signal IN5 and its inverted counterpart (provided by inverter 365). The output of multiplexer 440 is inverted by inverter 359 and provides output signal O5. Thus, output signal O5 can provide any function of up to five input signals, IN1-IN5. Inverters can be inserted wherever desired in the multiplexer structure, with an additional inversion being nullified by simply storing inverted data in the configuration memory cells M0-M63. For example, the embodiment of FIG. 3 shows bubbles on the output terminals of multiplexers 300-315, which signifies an inversion (e.g., an inverter) on the output of each of these multiplexers.

Multiplexers 340 and 341 both drive data input terminals of multiplexer 350, which is controlled by input signal IN6 and its inverted counterpart (provided by inverter 366) to select either of the two signals from multiplexers 340-341 to drive output terminal O6. Thus, output signal O6 can either provide any function of up to five input signals IN1-IN5 (when multiplexer 350 selects the output of multiplexer 341, i.e., when signal IN6 is high), or any function of up to six input signals IN1-IN6. In the pictured embodiment, multiplexer 350 is implemented as two three-state buffers, where one buffer is driving and the other buffer is disabled at all times. The first buffer includes transistors 351-354, and the second buffer includes transistors 355-358, coupled together as shown in FIG. 3. As will be described in more detail below, the memory cells M0-M63, as well as memory cells storing configuration data controlling multiplexers of the circuit of FIG. 2, may be periodically read back to ensure that the values have not been inadvertently changed.

Figure 4:
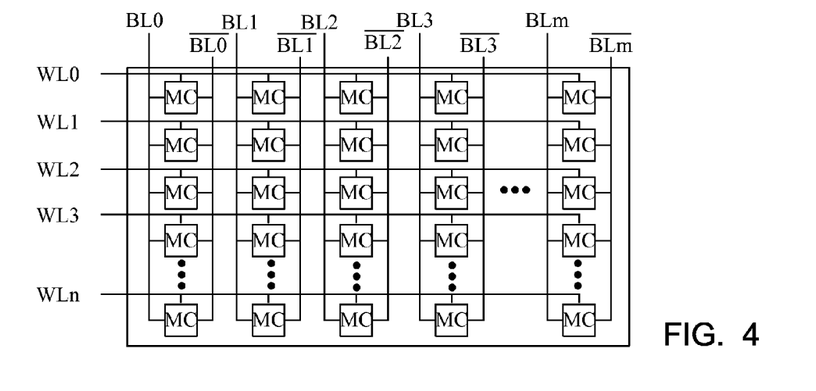
FIG. 4 is a block diagram of a memory array according to an embodiment of the present invention.

Turning now to FIG. 4, a block diagram of a memory array according to an embodiment of the present invention is shown. In particular, the memory array of FIG. 4 comprises a plurality of memory cells (MC) arranged in a matrix of rows and columns. The memory array of FIG. 4 could be a 64-bit memory having 8-bit rows and 8-bit columns, and could store configuration data for controlling multiplexers of the circuit of FIG. 2 or the look-up table of FIG. 3, for example. As shown in FIG. 4, each row of cells is addressed by a word line, and each column is addressed by a bit line and an inverted bit line, enabling data to be stored in the memory cell by selecting a word line and a bit line. According to one aspect of the invention, dimensions of transistors of the various memory cells may be selected to enable certain nodes to have a preference for storing either a logical "1" or a logical "0", as will be described in more detail below. That is, the dimensions of the transistors are selected so that a memory cell will prefer to store a certain logical value, as will be described in more detail below.

Figure 5:
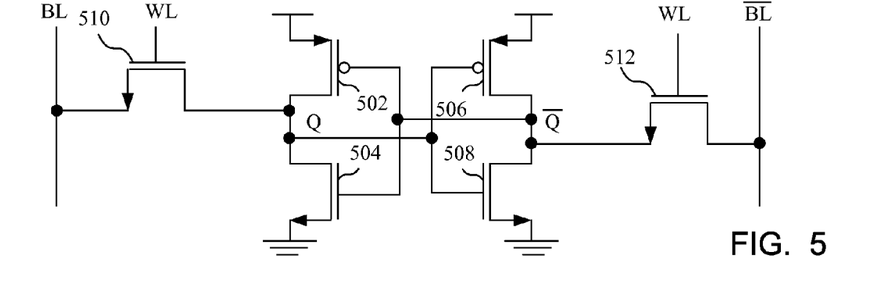
FIG. 5 is a block diagram of a memory cell of the memory array of FIG. 4 according to an embodiment of the present invention.

Turning now to FIG. 5, a block diagram of a memory cell of a memory array according to an embodiment of the present invention is shown. In particular, a memory cell according to one embodiment comprises an inverter having a p-channel transistor 502 having a source coupled to a reference voltage, such as Vcc, and a drain coupled at a first node "Q" to a drain of an n-channel transistor 504, the source of which is coupled to ground. The memory cell comprises a second inverter having a p-channel transistor 506 having a source coupled to the reference voltage and a drain coupled at a second node "Q-bar" to a drain of an n-channel transistor 508, the source of which is also coupled to ground. The first node "Q" is controlled by an n-channel transistor 510 coupled to receive a word line signal at its gate to receive input data at the first node, while the second node "Q-bar" is controlled by another n-channel transistor 512 coupled to receive the word line signal at its gate to receive inverted input data.

Figure 6:
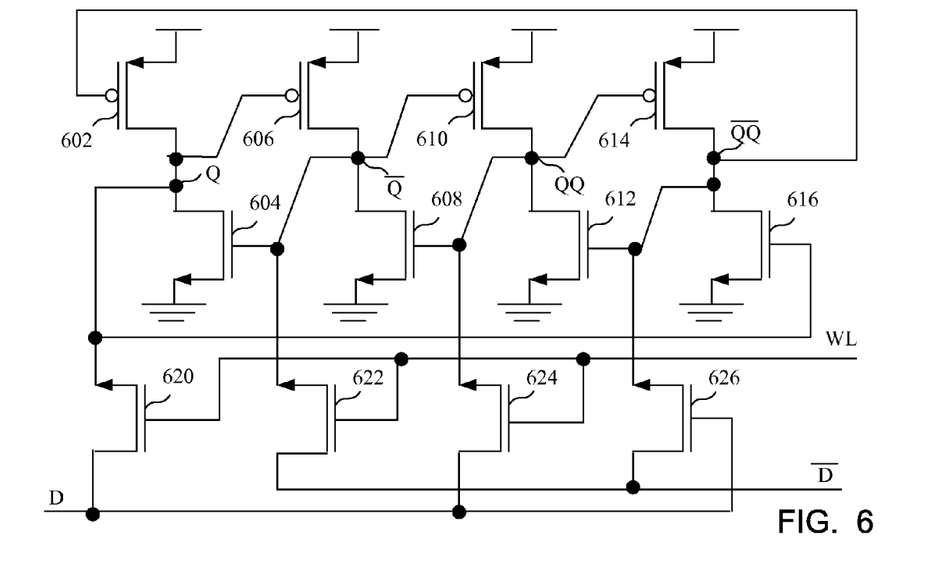
FIG. 6 is a block diagram of a memory cell of the memory array of FIG. 4 according to an alternate embodiment of the present invention.

Turning now to FIG. 6, a block diagram of a memory cell of a memory array according to an alternate embodiment of the present invention is shown. In particular, a plurality of inverters are provided where the input data is stored at two nodes and the inverted input data is stored at two nodes, making it more difficult for the data to be unintentionally changed. That is, according to the embodiment of FIG. 6, if data in one of the nodes is unintentionally changed, the value of that node will be changed back by the rest of the cell. A p-channel transistor 602 and an n-channel transistor 604 of a first inverter are coupled to create a first node "Q". The gate of the p-channel transistor 602 is coupled to the reference voltage, while the first node "Q" is formed where the drains of transistors 602 and 604 are connected. The source of transistor 604, as well as the sources of the other n-channel transistors of the inverters, are coupled to ground. Similarly, the source of the p-channel transistor 606 is coupled to the reference voltage, while the second node "Q-bar" is formed where the drains of transistors 606 and 608 are connected. The source of the p-channel transistor 610 is coupled to the reference voltage, while the third node "QQ" is formed where the drains of transistors 610 and 612 are connected. Finally, the source of the p-channel transistor 614 is coupled to the reference voltage, while the fourth node "QQ-bar" is formed where the drains of transistors 614 and 616 are connected.

A group of transistors 620-626 are also used to couple the data and inverted data to the nodes of the memory array. In particular, transistors 620 and 624 are used to couple the data to the first and third nodes while transistor 622 and 626 are used to couple the inverted data to the second and fourth nodes. Finally, the gates of the transistor of the inverter are controlled by first through fourth nodes. In particular, the p-channel transistors 606, 610 and 614 of the second, third and fourth inverters are coupled to receive the data from the first, second and third nodes, respectively, while the p-channel transistor 602 of the first inverter is coupled to receive data from the fourth node. The gates of the n-channel transistors 604, 608 and 612 of the first, second and third inverters are coupled to receive the data from the second, third and fourth nodes, while the gate of the n-channel transistor 616 of fourth inverter is coupled to receive data from the first node. The dimensions of the transistors may be selected to enable nodes to have a preference for storing either a logical "1" or a logical "0", as will be described in reference to the memory cells of FIGS. 7-9.

Figure 7:
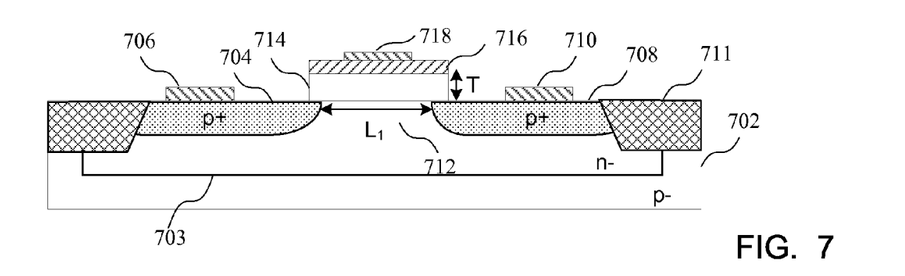
FIG. 7 is a cross-sectional view of a transistor of a memory cell of FIG. 5 or 6 according to an embodiment of the present invention.
Figure 8:
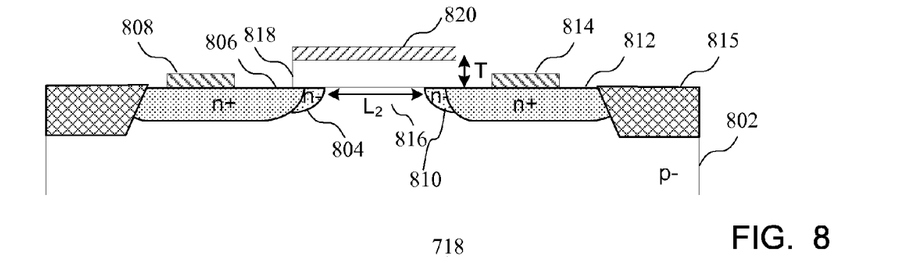
FIG. 8 is a cross-sectional view of a transistor of a memory cell of FIG. 5 or 6 according to an alternate embodiment of the present invention.

Turning now to FIG. 7, a cross-sectional view of a transistor of a memory cell according to an embodiment of the present invention is shown. The p-channel transistor of FIG. 7 comprises a substrate 702 comprising an n-doped well 703 having a p-doped region 704 comprising a source contact 706 and a p-doped region 708 comprising a drain contact 710. The p-regions are formed inside of a shallow trench isolation (STI) region 711, which may comprise an oxide as is well known in the art. The p-regions define a channel 712 having a channel length $L_1$. A gate oxide having a thickness T separates a gate 716 having a gate contact 718 from the substrate 702. As is well known in the art, a channel is formed when certain voltages are applied to the source, drain and gate. Similarly, as shown in FIG. 8, a cross-sectional view of a n-channel transistor of a memory cell is shown. In particular, the n-channel transistor of FIG. 8 comprises a substrate 802 having a lightly doped (n-) region 804 and an n-doped region 806 having a source contact 808, and a lightly doped (n-) region 810 and a n-doped region 812 comprising a drain contact 814. The n-regions are also formed inside of a shallow trench isolation region 815. The n-regions and the lightly doped regions define a channel 816 having a channel length $L_2$. As can be seen, the lightly doped regions reduce the channel length of the device. While lightly-doped regions are shown by way of example in the embodiment of FIG. 8, lightly doped regions may also be employed in the memory cell of FIG. 7. A gate oxide 818 having a thickness T separates a gate 820 from the substrate 802.

Figure 9:
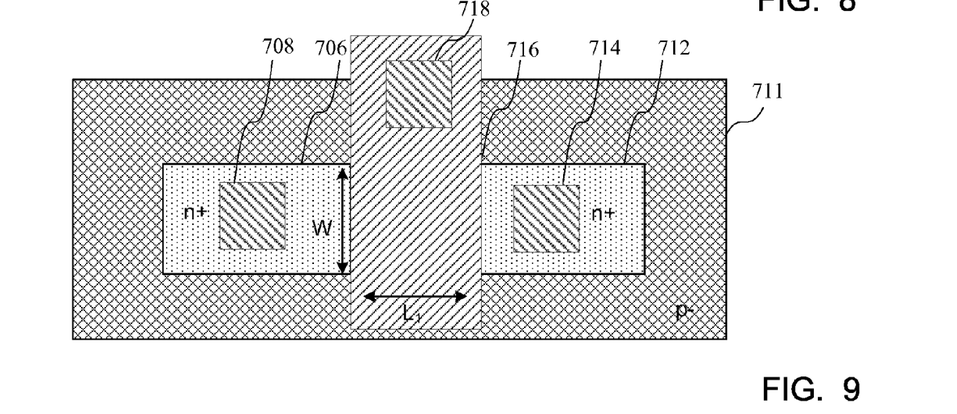
FIG. 9 is a top-pan view of a transistor of the memory cell of FIG. 7 according to an embodiment of the present invention.

As can be seen in FIG. 9, showing the top-pan view of a transistor of the memory cell of FIG. 7, the width of the diffusion regions which correspond to the space created by the STI regions define a width of the channel 712. The dimensions of the transistor of the circuits of FIGS. 5 and 6 may be modified to enable nodes of a memory cell to have a preference for storing either a logical "1" or a logical "0." In particular, dimensions of certain transistor may be selected to provide certain characteristics for the transistor, such as making the transistor stronger or weaker. A stronger transistor will turn on faster and drive more current than a weaker transistor, and therefore force a node to a particular voltage. In the embodiment of FIG. 5, the transistors may be designed so that the cell would have a preference for storing a logical "0". That is, if the data is affected by a single event upset (SEU), such as a cosmic ray striking a memory cell of the device for example, both nodes "Q" and "Q-bar" receive extra charge which put the cell in an unstable state. That is, as the size of transistors continue to shrink, the excess charge is more likely to affect more than a single transistor. However, after any excess charge has dissipated in a conventional device, it is uncertain what value the memory cell would store.

According to one embodiment, the memory cells of the memory array may be configured so that they will be likely to return to a value of zero if they are hit by excess charge which will later dissipate. That is, if the "Q" and "Q-bar" nodes are temporarily put in an unstable state, they are more likely to return to the preferred state. The memory cell would prefer a logical "0" by making one of the p-channel transistors stronger than the other p-channel transistor or making one of the n-channel transistors stronger than the other n-channel transistor. In particular, the memory cell of FIG. 5 would prefer a logical "0" in the first node "Q" by decreasing the channel length of the p-channel transistor 506 with respect to the p-channel transistor 502, increasing the channel width of the p-channel transistor 506 with respect to the channel width of the p-channel transistor 502, lowering the turn-on threshold voltage ($V_T$) of the p-channel transistor 506 with respect to the channel width of the p-channel transistor 502, or any combination of the these measures which make p-channel transistor 506 stronger than p-channel transistor 502. While the channel length may be changed by decreasing the distance between the doped regions, decreasing the channel length may be achieved by using a lightly doped drain (LDD). Lowering the turn-on threshold voltage of the p-channel transistor 506 may be accomplished by implementing separate implant masks to implement a gate oxide having a thinner gate oxide or implementing different gate oxides for p-channel transistors.

Similarly, the dimensions of the n-channel transistor 504 could be altered with respect to the n-channel transistor 508. The memory cell of FIG. 5 would prefer a logical "0" in the first node "Q" by decreasing the channel length of the n-channel transistor 504 with respect to the n-channel transistor 508, increasing the channel width of the n-channel transistor 504 with respect to the channel width of the n-channel transistor 508, lowering the turn-on threshold voltage ($V_T$) of the n-channel transistor 504 with respect to the threshold voltage of the n-channel transistor 508, or any combination of the these measures which make the n-channel transistor 504 stronger than the n-channel transistor 508.

Similarly, the dimensions of the transistors of FIG. 6 may be selected so that the memory cell would prefer a logical "0" in the first node "Q" and the third node "QQ" and a logical "1" in the second node "Q-bar" and the fourth node "QQ-bar." According to one embodiment, in order to make the memory cell prefer a logical "0" in nodes "Q" and "QQ," transistors 606 and 614 are made stronger than transistors 602 and 610. Alternatively, transistors 604 and 612 may be made stronger than transistors 608 and 616. A transistor may be made stronger by decreasing the channel length of a transistor relative to another transistor, increasing the channel width, or lowering the threshold voltage, or a combination of these techniques as set forth above.

Figure 10:
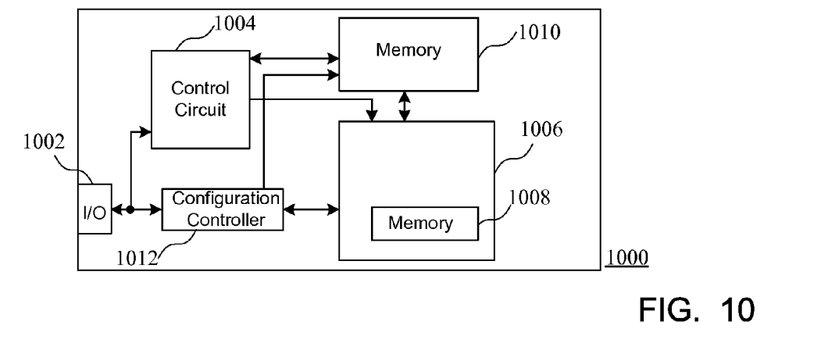
FIG. 10 is a block diagram of a device having programmable logic and a memory array according to an embodiment of the present invention.

Turning now to FIG. 10, a block diagram of a device having programmable logic and a memory array according to an embodiment of the present invention is shown. The circuit of FIG. 10 comprises a programmable logic device 1000 having an input/output port 1002 coupled to a control circuit 1004 and a programmable logic circuit 1006. The circuits implemented in the programmable logic circuit are implemented according to configuration data downloaded to the integrated circuit 1000 as described above in reference to FIGS. 1-3 and using the circuits of FIGS. 1-3. The programmable logic circuit 1006 comprises a configuration memory array 1008, where the programmable logic circuit implements a circuit based upon the data loaded into the memory array 1008, as described above. The programmable logic circuit may also comprise a non-volatile memory 1010 for storing configuration data. Accordingly, configuration data may be loaded into configuration memory cells of the programmable logic circuit by a configuration controller 1012, or the configuration data may be stored in a non-volatile memory 1010 which may be controlled by the control circuit or the configuration controller. Although the circuit of FIG. 10 is shown by way of example as a circuit for configuring programmable logic and reading back data, other configurations may be employed to configure a device and verify the contents of a memory according to the invention.

According to one unique aspect of the invention, configuration data stored in the configuration memory may be read back to ensure the data is correct and that no data has been corrupted. The data which is read back is compared against known data to determine which memory elements need to be rewritten to their correct values. Because only a few memory elements for selecting a multiplexer in a CLE of a configurable logic block may need to be a "1" to implement a function in many cases or only some elements of a lookup table may be used, approximately 90% of the configuration bits of a device having programmable logic on average are a logical "0". By implementing the circuit as set forth above where the cells of the memory array have a preference for a logical "0", fewer cells will need to be corrected after cells are unintentionally changed. That is, because the cells of a memory array modified to prefer a logical "0" will return to a logical "0" after they are brought to an unstable state by unintentional electrical charge which will dissipate, 90% of the cells on average will likely return to their normal states. If all of the cells return to the preferred state, 90% will be in their normal state and only 10% of the cells may need to be rewritten. While not all of the memory elements will necessarily return to the preferred state, a significant number of cells will return to their preferred state, and therefore reduce the number of cells which need to be rewritten. By reducing the amount of cells which may need to be written, the amount of time to fix any inadvertently changed cells to their correct value will be significantly reduced. Accordingly, the data in fewer cells will need to be corrected, and the readback of the memory cells may be performed more frequently. However, it should be noted that while the circuits of FIGS. 5 and 6 are described in reference to storing a logical "0" in nodes "Q" or "QQ", the circuit could also be employed to store a logical "1" in nodes "Q" and "QQ" by transposing the designations for "Q" and "QQ" with "Q-bar" and "QQ-bar", respectively.

Figure 11:
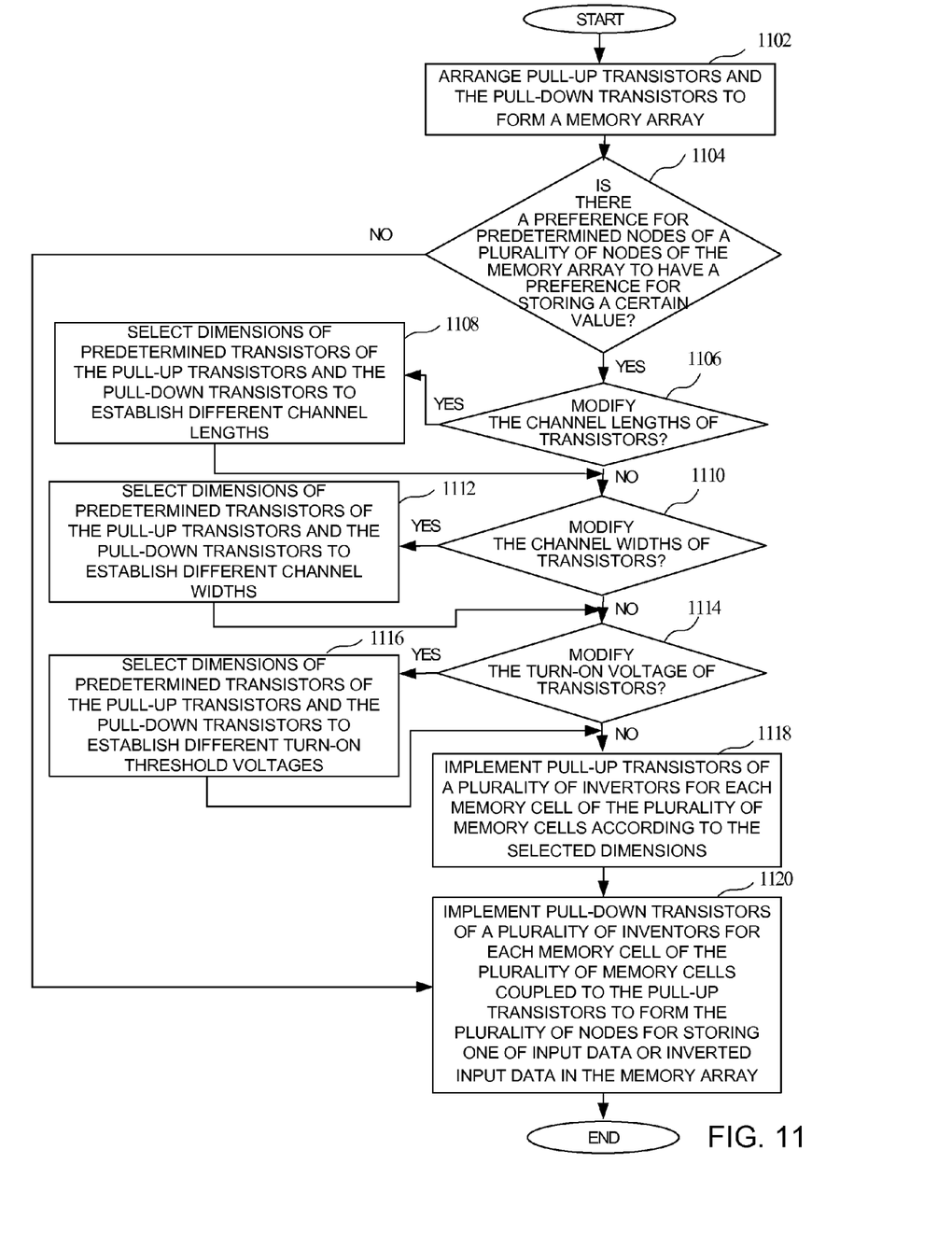
FIG. 11 is a flow chart of a method for implementing a memory array according to an embodiment the present invention.

Turning now to FIG. 11, a flow chart shows a method for implementing a memory array according to an embodiment the present invention. In particular, pull-up transistors and the pull-down transistors are arranged to form a memory array at a step 1102. The arrays could be implemented according to the circuits of FIGS. 5 and 6, for example. It is then determined if there is a preference for a predetermined node or all of the nodes of a plurality of nodes of the memory array to store a certain value, such as a logical zero, at a step 1104. If so, it is determined whether the channel lengths of transistors should be modified at a step 1106. If so, dimensions of pre-determined transistors of the pull-up transistors and the pull-down transistors are selected to establish different channel lengths for the predetermined transistors at a step 1108. It is then determined whether the channel widths of transistors should be modified at a step 1110. If so, dimensions of pre-determined transistors of the pull-up transistors and the pull-down transistors are selected to establish different channel widths for the predetermined transistors at a step 1112. It is then determined whether the turn-on voltage of transistors should be modified at a step 1114. If so, dimensions of pre-determined transistors of the pull-up transistors and the pull-down transistors are selected to establish different turn-on threshold voltages for the predetermined transistors at a step 1116. Accordingly, one or more steps for making one transistor stronger than another transistor may be implemented as described above in reference to FIGS. 5 and 6 to create a preference for a certain logical value. Pull-up transistors of a plurality of invertors for each memory cell of the plurality of memory cells are implemented according to the selected dimensions at a step 1118. Finally, a pull-down transistors of a plurality of invertors for each memory cell of the plurality of memory cells coupled to the pull-up transistors are implemented to form the plurality of nodes for storing one of an input data or inverted input data in the memory array at a step 1120. The method of FIG. 11 may be implemented using any of the circuits of FIGS. 1-10 as described or any other suitable circuit.

It can therefore be appreciated that the new and novel memory array and method of implementing a memory array has been described. It will be appreciated by those skilled in the art that numerous alternatives and equivalents will be seen to exist which incorporate the disclosed invention. As a result, the invention is not to be limited by the foregoing embodiments, but only by the following claims.

I claim:

1. A memory array having a plurality of memory cells, each memory cell comprising:
   a first inverter comprising a first transistor coupled between a reference voltage and a first node for receiving input data and a second transistor coupled between the first node and ground;
   a second inverter comprising a third transistor coupled between the reference voltage and a second node for storing inverted input data and a fourth transistor coupled between the second node and ground, the second node being coupled to a control terminal of the second transistor;
   a third inverter comprising a fifth transistor coupled between the reference voltage and a third node for storing the input data and a sixth transistor coupled between the third node and ground, the third node being coupled to a control terminal of the fourth transistor; and a fourth inverter comprising a seventh transistor coupled between the reference voltage and a fourth node for storing the inverted input data and an eight transistor coupled between the fourth node and ground, the fourth node being coupled to a control terminal of the sixth transistor;

wherein the third and seventh transistors are implemented with physical dimensions which make the third and seventh transistors stronger than the first and fifth transistors, or the second and sixth transistors are implemented with physical dimensions which make the second and sixth transistors stronger than the fourth and eighth transistors.

2. The memory array of claim 1 wherein the first node is coupled to a control terminal of the eighth transistor.

3. The memory array of claim 1 further comprising a ninth transistor coupled to the first node and a tenth transistor coupled to the third node, wherein the ninth transistor and the tenth transistor couple data to the first node and the third node.

4. The memory array of claim 3 further comprising an eleventh transistor coupled to the second node and a twelfth transistor coupled to the fourth node, wherein the eleventh transistor and the twelfth transistor couple inverted data to the second node and the fourth node.

5. The memory array of claim 1 wherein channel lengths of the third transistor and the seventh transistor are less than channel lengths of the first transistor and the fifth transistor, or channel lengths of the second transistor and the sixth transistor are less than channel lengths of the fourth transistor and the eighth transistor.

6. The memory array of claim 1 wherein channel widths of the third transistor and the seventh transistor are greater than the channel widths of the first transistor and the fifth transistor, or channel widths of the second transistor and sixth transistor are greater than channel widths of the fourth transistor and the eighth transistor.

7. A method of implementing a memory array having a plurality of memory cells, the method comprising:

providing a first inverter comprising a first transistor coupled between a reference voltage and a first node for receiving input data and a second transistor coupled between the first node and ground;

providing a second inverter comprising a third transistor coupled between the reference voltage and a second node for storing inverted input data and a fourth transistor coupled between the second node and ground, the second node being coupled to a control terminal of the second transistor;

providing a third inverter comprising a fifth transistor coupled between the reference voltage and a third node for storing the input data and a sixth transistor coupled between the third node and ground, the third node being coupled to a control terminal of the fourth transistor;

providing a fourth inverter comprising a seventh transistor coupled between the reference voltage and a fourth node for storing the inverted input data and an eight transistor coupled between the fourth node and ground, the fourth node being coupled to a control terminal of the sixth transistor; and implementing the third and seventh transistors with physical dimensions which make the third and seventh transistors stronger than the first and fifth transistors, or implementing the second and sixth transistors with physical dimensions which make the second and sixth transistors stronger than the fourth and eighth transistors.

8. The method of claim 7 further comprising coupling the first node to a control terminal of the eighth transistor.

9. The method of claim 7 further comprising coupling a ninth transistor to the first node and coupling a tenth transistor to the third node, wherein the ninth transistor and the tenth transistor couple data to the first node and the third node.

10. The method of claim 7 further comprising coupling an eleventh transistor to the second node and coupling a twelfth transistor to the fourth node, wherein the eleventh transistor and the twelfth transistor couple inverted data to the second node and the fourth node.

11. The method of claim 7 wherein implementing the third and seventh transistors or the second and sixth transistors comprises selecting channel lengths of the third transistor and the seventh transistor that are less than channel lengths of the first transistor and the fifth transistor, or selecting channel lengths of the second transistor and the sixth transistor that are less than channel lengths of the fourth transistor and the eighth transistor.

12. The method of claim 7 wherein implementing the third and seventh transistors or the second and sixth transistors comprises selecting channel widths of the third transistor and the seventh transistor that are greater than channel widths of the first transistor and the fifth transistor, or selecting channel widths of the second transistor and the sixth transistor that are greater than channel widths of the fourth transistor and the eighth transistor.

13. The method of claim 7 wherein implementing the third and seventh transistors or the second and sixth transistors comprises setting the turn on voltage thresholds of the third transistor and the seventh transistor lower than the turn-on voltage thresholds of the first transistor and the fifth transistor, or setting the turn-on voltage thresholds of the second transistor and the sixth transistor lower than the turn-on voltage thresholds of the fourth transistor and the eighth transistor.

* * * * *